United States Patent [19]

Arntz

[11] 4,079,358
[45] Mar. 14, 1978

[54] BURIED JUNCTION MOS MEMORY CAPACITOR TARGET FOR ELECTRON BEAM ADDRESSABLE MEMORY AND METHOD OF USING SAME

[75] Inventor: Floyd O. Arntz, Newton, Mass.

[73] Assignee: Micro-Bit Corporation, Lexington, Mass.

[21] Appl. No.: 729,099

[22] Filed: Oct. 4, 1976

[51] Int. Cl.² ................. G11C 11/26; G11C 13/00
[52] U.S. Cl. ........................... 365/118; 365/149; 365/237
[58] Field of Search ...... 340/173 R, 173 LS, 173 LT, 340/173 CR; 357/31; 313/65 AB

[56] References Cited

U.S. PATENT DOCUMENTS

| | | | |
|---|---|---|---|
| 3,761,895 | 9/1973 | Ellis et al. | 340/173 CR |
| 3,763,476 | 10/1973 | Wilson et al. | 340/173 CR |
| 3,786,441 | 1/1974 | Engler et al. | 340/173 R |

Primary Examiner—Terrell W. Fears
Attorney, Agent, or Firm—Charles W. Helzer

[57] ABSTRACT

A buried junction MOS memory capacitor target device for electron beam addressable READ/WRITE memories is described along with a method of using the same. The memory capacitor target structure comprises a planar semiconductor substrate of various degrees of complexity having a highly conducting coating providing a low resistance ohmic contact to the substrate backside and an N-type planar semiconductor overlayer forming with the substrate topside a bipolar detector junction. An insulating layer overlies the N-type layer and a conducting coating overlies the insulating layer. The device is employed with an electron beam of sufficient energy to penetrate the latter two layers and to produce carrier-pairs in the N-type overlayer. Electrical access to the device is provided by one contact to the substrate backside and one contact to the conducting coating overlying the insulator. Means are provided within the semiconducting portion of the device for limiting the electrostatic potential difference developed across the bipolar detector junction as a result of changes in the potentials applied to the electrical contacts. This may be achieved by fabricating the semiconducting portion of the device to provide for the occurrance of avalanche conduction within the detector junction whenever the reverse polarity potential difference across the junction exceeds a desired value. Alternatively the reach through effect commonly observed in thin base bipolar transistors when the collector-base potential difference exceeds a critical value can be employed to limit the reverse potential developed across the bipolar detector junction. This may be achieved by employing a planar semiconducting substrate comprised by a thin P-type layer overlying an N-type layer. In operation the design affords a means for applying the desired potential differences across the insulator for the various steps of memory operation and also affords a means for developing a desired reverse polarity potential difference across the buried bipolar detector junction for the duration of the read process.

31 Claims, 17 Drawing Figures

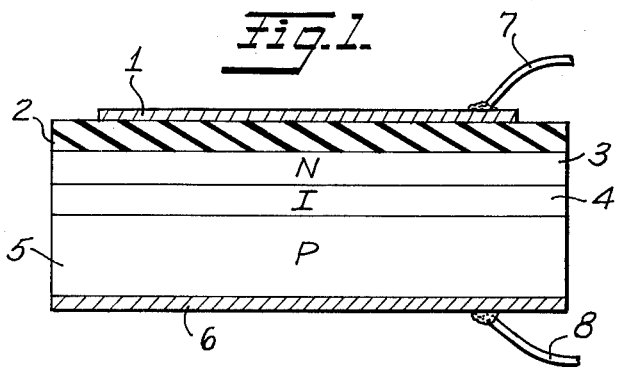
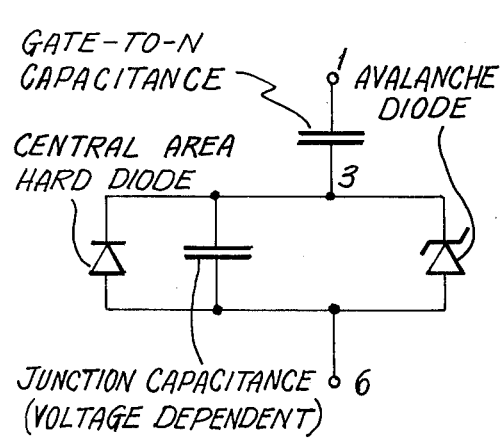
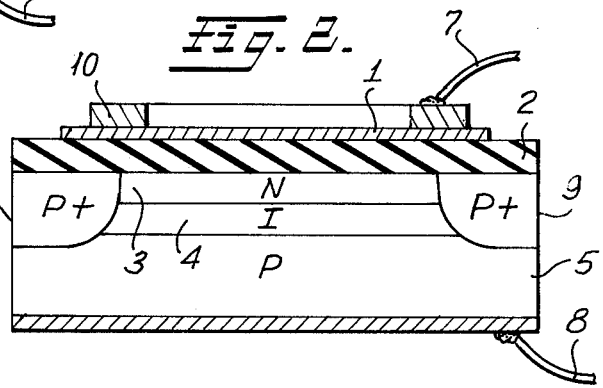
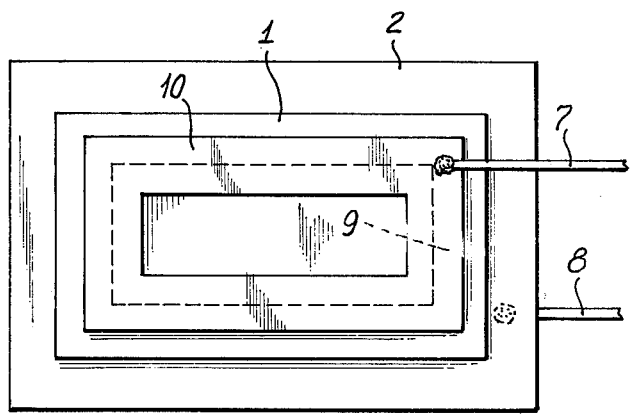
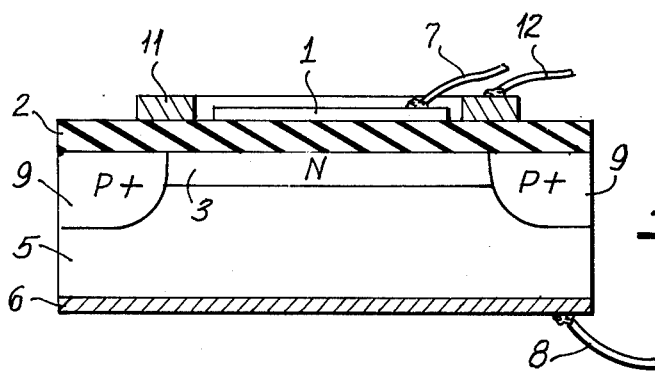

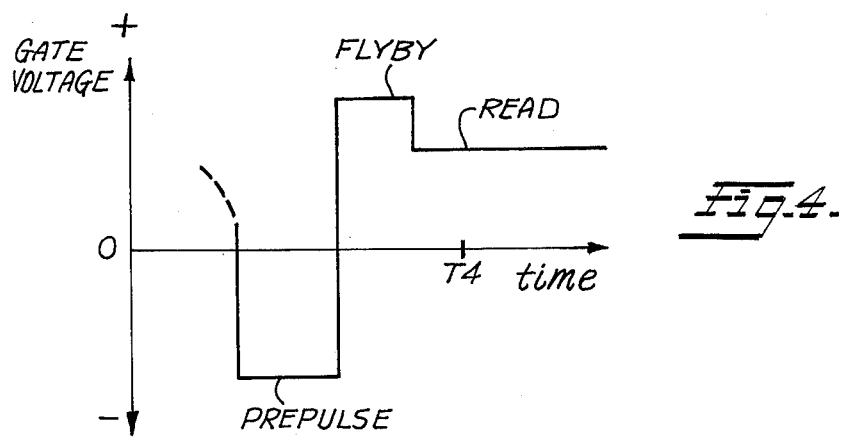
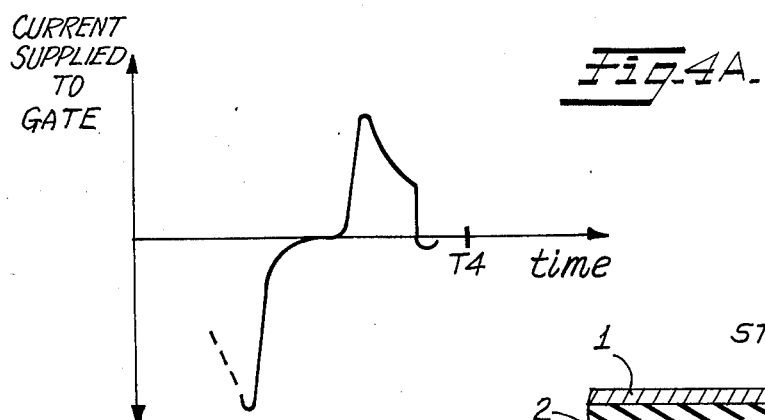
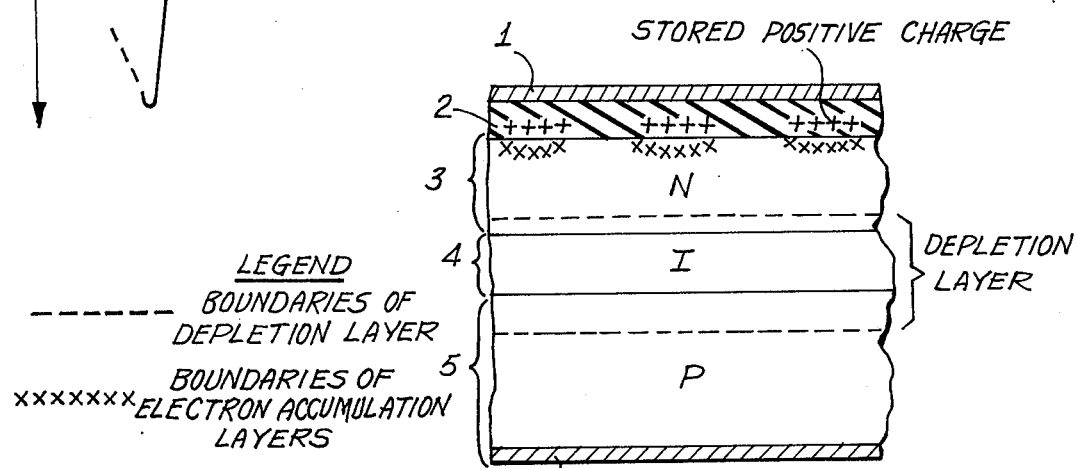
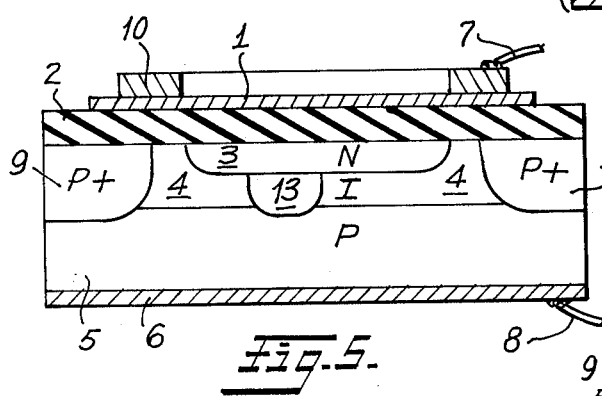
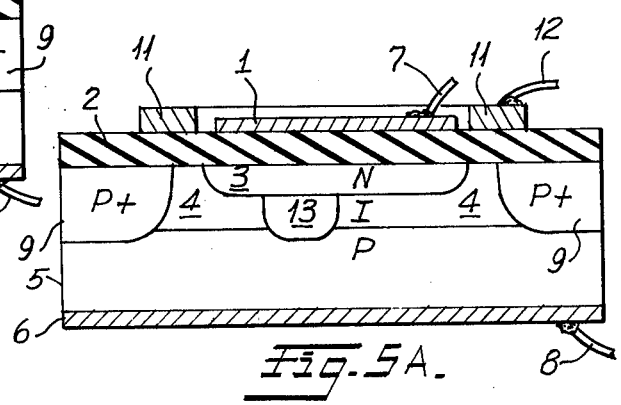

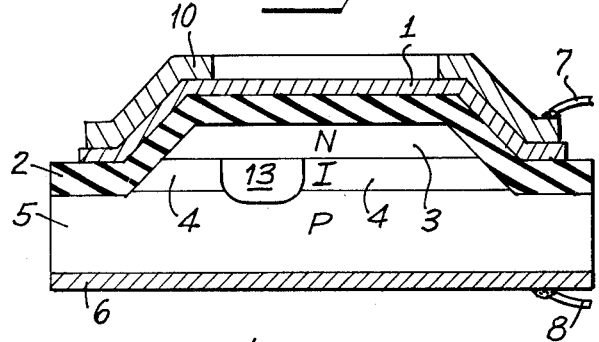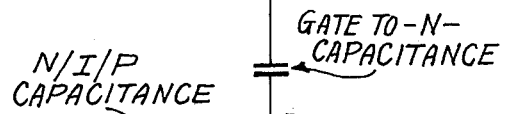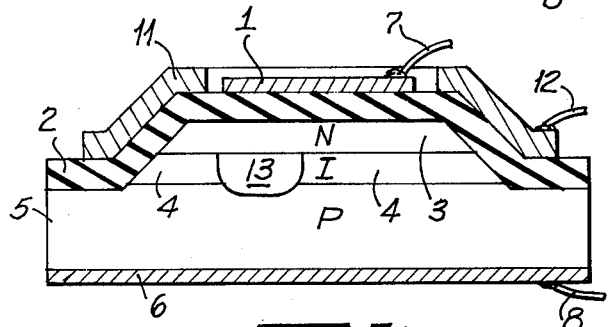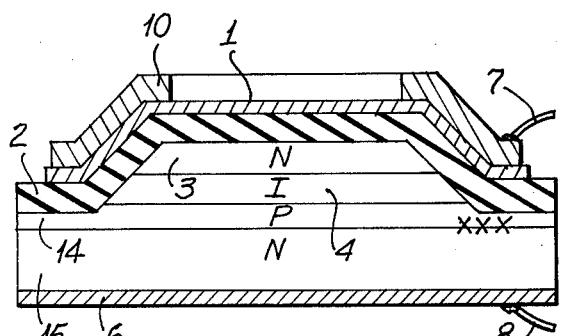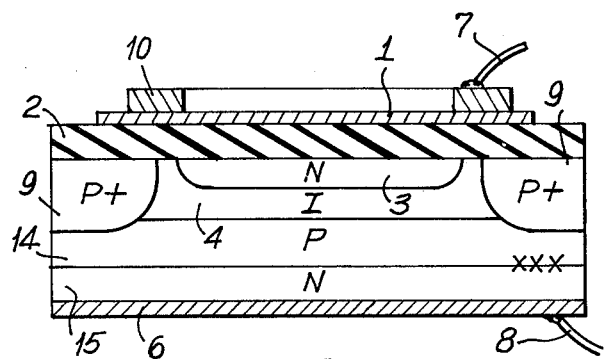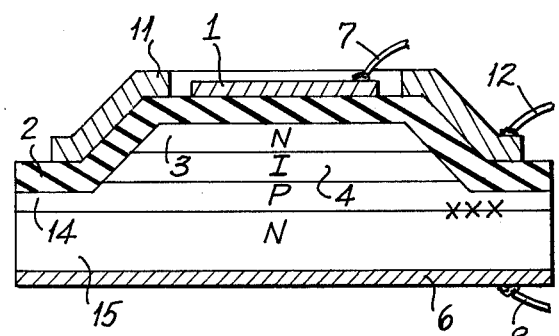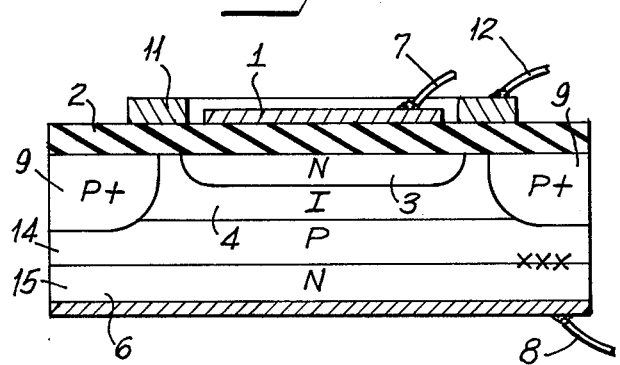

BURIED JUNCTION MOS MEMORY CAPACITOR TARGET FOR ELECTRON BEAM ADDRESSABLE MEMORY AND METHOD OF USING SAME

BACKGROUND OF INVENTION

1. Field of Invention

This invention relates to a new and improved buried layer metal-insulator-semiconductor memory capacitor device for use as a target element with electron beam accessed memories and to the method of its use in an electronic memory system.

2. Background of Invention

Electron beam addressable memories for use as the main or peripheral memory of a computer system have been under investigation for a number of years. One known form of a workable electron beam addressable memory employing a metal-insulator-semiconductor capacitor structure as the memory element target was first described in an article entitled "Electron Beam Detection of Charge Storage in MOS Capacitors", appearing in Applied Physics Letters, Volume 16, No. 4, pages 147–149, February, 1970 and has been disclosed further in U.S. Pat. Nos. 3,736,571, issued May 29, 1973 and in U.S. Pat. No. 3,886,530, issued May 27, 1975. Electron beam addressable memories which employ multi-layered semi-conductors having p-n junctions through which reverse current flow is induced by injection of electrons by an electron beam probe, have been described in U.S. Pat. Nos. 3,550,094, issued Dec. 22, 1970, in U.S. Pat. No. 3,761,895, issued Sept. 25, 1973 and in an article entitled "A Semiconductor Nonvolatile Electron Beam Accessed Mass Memory" appearing in the Proceedings of the IEEE, Volume 63, No. 8, August, 1975, pgs. 1230–1239.

The electron beam addressable memories employing built in multi-layered semiconductor target structures described in the last mentioned U.S. patents and publication all employ metal-insulator-semiconductor memory target structures which require external conductive electrical connection access to two or more semiconductor layers of opposite conductivity type and an electrically conducting overlayer for application of suitable biases during operation of the memory. To overcome the requirement in an electron beam accessible memory of employing three or more terminals in capacitive read-out, metal-insulator-semiconductor target structures having two or more different conductivity type semiconductors layers defining a p-n junction, the present invention was devised.

SUMMARY OF INVENTION

It is therefore a primary object of the invention to provide a new and improved buried junction metal-insulator-semiconductor memory capacitor structure for use as a target element with electron beam accessible memories and to describe the use of such target structures in computer memory systems.

Another object of the invention is to provide such a new and improved target structure which is of relatively simple construction and inexpensive to manufacture.

Still another object of the invention is to provide such a new and improved memory element target structure which provides for high performance and reliability and allows fast memory speed of operation i.e., microsecond response times to an instruction or inquiry from a central processor or other controller unit accessing the memory.

A still further object of the invention is to provide such a buried junction target structure which does not require a multiplicity of bias potential sources or more than two terminal electrical access connection points for each target structure employed in a memory system thereby simplifying construction and operation of the electron beam accessible memory system.

The present invention provides the above listed advantageous features with little degradation of response time due to the fact that the structure is fabricated in such a manner that it automatically limits the magnitude of reverse bias potential built up across the detector junction by avalanche breakdown of the junction, or reach through to a richly doped region to thereby allow for proper biasing of the insulator and junction during write and read operations without requiring direct electrical access biasing across the insulator layer.

In practicing the invention, a new and improved buried junction metal-insulator-semiconductor memory capacitor target structure is provided for electron beam addressable memories and makes available a new method of operation of such memories not heretofore attainable.

The memory capacitor target structure comprises a planar crystalline semiconductor substrate of varying complexity being composed of one or more distinct doping regions as described hereafter. The substrate has a highly conductive film formed on its backside surface and a planar semiconductive layer of N-type formed on the topside surface thereof. The latter N-type layer and the substrate together form an N/P or N/I/P ("I" meaning intrinsic or near-intrinsic) junction at their interface. All embodiments of the device described herein may employ either an N/P or an N/I/P junction. Although the descriptions are based upon an N/I/P junction, the presence of the I-layer should be regarded as optional. The I layer (if included) is used primarily to tailor the junction capacitance to a desired design value. An insulating layer overlies the aforementioned N-type semiconductor layer and a conducting layer overlies the insulating layer with the last mentioned conducting layer having means for providing direct electrical connection thereto. The conductive film on the backside of the substrate makes low resistance ohmic electrical contact to the substrate and also has means provided for direct electrical connection to an external load or contact. Overlying the insulator covering the perimeter of the N/I/P junction is a localized conducting layer which strongly attenuates the incident electron beam. This conducting and attenuating ring can be formed integral to the aforementioned conducting overlayer or can be formed in a manner so as to enclose the perimeter of conducting overlayer but remain physically separate. In the latter case electrical access means is provided to the enclosing attenuating ring and to the enclosed conducting overlayer.

Enclosure means are provided for completely closing off exterior direct connection electrical access to the N-type semiconductor layer overlying the substrate and means are provided within the memory capacitor structure for limiting the magnitude of any reverse polarity potential difference built up across the associated junction upon variation of potentials applied to the contacts of the capacitor structure. In a preferred embodiment of the invention, the means for limiting the magnitude of the reverse polarity potential as well as the means for completely closing off exterior direct connection electrical access to the N-type semiconductor overlayer comprises a peripherally arranged region of highly doped P-type semiconductive material and an insulator layer which totally covers the N-type layer overlying the substrate and also totally covers the inner margins of the peripherally arranged P-type material. The latter peripherally enclosing P-type semiconducting layer forms a metallurgical junction with the N-type layer and also extends in depth into the P-type body of the substrate. The metallurgical junction thus formed serves to provide avalanche or zener diode action at a desired value of reverse polarity potential difference.

The latter embodiment will hereinafter be identified as a perimeter avalanche device. In this case and in the case which follows immediately hereafter, the planar semiconducting substrate is comprised of a P-type body with an optional intrinsic semiconducting layer formed on the topside. Alternatively, the substrate can be fabricated in such a manner as to provide for avalanche breakdown within selected areas within the main body of the N/I/P junction at a desired value of reverse polarity potential difference. Such embodiment will hereinafter be identified as a topical avalanche device. The perimeter of the N-type overlayer in the topical avalanche device can be bounded either by an enclosing heavily doped P-type region which reaches into the substrate P-type layer or it can be bounded by an etched back tilted surface which penetrates through to the substrate P-type layer. In the latter case, the N-type overlayer and the adjoining semiconducting intrinsic layer form a mesa residing upon the P-type body of the planar substrate. In the case of the mesa isolated topical avalanche device the insulating layer completely covers the mesa, the sidewalls of the mesa and the inner margins of the P-type surface extending outward from the mesa sidewalls.

In another preferred embodiment, identified herein as a reach through device, the planar semiconducting substrate consists of an optional intrinsic layer overlying a P-type layer which in turn overlies an N-type layer. Isolation of the N-type semiconductor layer overlying this substrate can be achieved by either of the means described above for the topical avalanche devices. The perimeter of the N-type layer can be bounded by a P-type region which penetrates through to the P-type layer in the substrate or the N-type layer can be isolated as a mesa with the sidewalls of the mesa extending into the P-type layer in the substrate. In these cases the topside insulator layer entirely covers the N-type layer and extends outward over either the enclosing P-type region or the mesa sidewalls and the P-type substrate layer extending outward therefrom. Although additional control of the reach through effect can be accomplished by employing separate electrical access means to the N and P regions of the substrate, the favored device embodiment is fabricated in a fashion which ensures that this underlying junction is "soft". That is, this junction is not appreciably rectifying. Mechanical plastic distortion of the material composing the junction or a simple metallic bridge (e.g. with aluminum) from the N to P regions of the substrate will accomplish this.

BRIEF DESCRIPTION OF DRAWINGS

These and other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein:

FIG. 1 is a schematic, cross sectional view of a buried junction metal-insulator-semiconductor memory capacitor target structure for an electron beam accessible memory and useful in explaining the principles of the present invention;

FIG. 2 is a cross sectional view of a preferred form of buried junction metal-insulator-semiconductor memory capacitor target structure constructed in accordance with the invention;

FIG. 2A is a plan view of the preferred form of memory capacitor target structure shown in FIG. 2;

FIG. 2B is a cross sectional view of an alternative form of the invention shown in FIG. 2;

FIG. 3 is a schematic circuit diagram which comprises a circuit model of the memory capacitor target structure shown in FIGS. 2, 2A and 2B;

FIGS. 4 and 4A are voltage vs. time and current vs. time characteristic curves, respectively, showing certain operating characteristics of electron beam accessible memories employing the devices shown in FIGS. 2, 2A and 2B;

FIG. 4B is a partial, cross sectional schematic view of a portion of the target structure shown in FIG. 2 and useful in explaining the operation of the target structure in a memory system;

FIGS. 5 and 5A are cross sectional views of alternative forms of new and improved buried layer metal-insulator-semiconductor memory capacitor target structures constructed in accordance with the invention which employ heavily doped "island" regions for reverse voltage limiting purposes;

FIGS. 6 and 6A are partial cross sectional views of a third form of the invention which utilize a "mesa" type of construction;

FIGS. 7 and 7A are partial cross sectional views of still another form of the invention which utilizes "punch through" between the layers for reverse voltage limiting purposes;

FIG. 8 is a schematic circuit model of the devices shown in FIGS. 7 and 7A; and

FIGS. 9 and 9A are partial cross sectional views of still other forms of the invention which utilize "mesa" type construction for the "punch through" type devices of FIGS. 7 and 7A.

DETAILED DESCRIPTION OF PREFERRED EMBODIMENT

The metal-insulator-semiconductor memory capacitor target structure shown in FIG. 1 may be used for storage of information in binary form in much the same manner as the large area MOS memory target structures described with relation to U.S. Pat. Nos. 3,736,571 and 3,886,530. Binary information so stored may be read by employing an electron beam to scan across or to probe those areas of the device in which data previously has been stored. The device, as well as other forms thereof described hereinafter also may be used to store and read out information in analog form. For a more detailed description of the physical mechanisms involved in the storage, erasure, and read out of information in MOS memory capacitor target structures in an electron beam addressable memory, reference is made to each of the above mentioned patents. Briefly, however, it can be stated that data is stored in a form of charge patterns induced within the insulator of the metal-insulator-semiconductor memory capacitor target. When penetrating radiation in the form of an electron beam is incident on the target structure and a sufficient magnitude bias is applied to the conducting layer (hereinafter referred to as the gate) which overlies the insulating layer the latter exhibits considerable transient induced conductivity in the areas subject to the irradiation. Because electrons produced within the silicon dioxide are much more mobile than holes, because the holes are rapidly trapped, and because the layers on either side of the insulating layer are not good injectors of electrons, a positive charge tends to develop within the insulator near the interface with the silicon if the silicon is at the more negative potential or near the gate if the gate is at the more negative potential. In the absence of further irradiation charge patterns produced in the above described fashion may persist for years. Writing of a block of data (hereinafter referred to as the WRITE operation) is performed by scanning an electron beam of about 10 kev focused to 3 micrometer diameter along a line on the surface of the memory capacitor. While scanning in this manner each site which one intends to CHARGE is selectively irradiated with a positive gate bias (about 40 volts). This process is then followed by a second scanning along the same line while applying a negative gate bias (about −30 volts) to the gate while selectively irradiating only those site locations which are to be DISCHARGED (ERASED). During the WRITE operation one may largely ignore what occurs within the semiconductor layer. However, it should be noted that when the gate is positive a significant portion, perhaps 5 volts to 20 volts, of the applied voltage may appear across the buried junction of a device such as shown in FIG. 1.

During the READ operation, reading is performed with the same electron beam probe while simultaneously applying a constant READ bias potential of −5 to +20 volts to the gate. As the electron beam is scanned along a line of data bit sites during the READ operation, an electron beam induced reverse current occurs across the reversed biased P-N junction under those locations CHARGED during the WRITE cycle, and no current (or a greatly reduced magnitude current) is produced under those bit site locations selectively DISCHARGED during the WRITE cycle. This electron beam induced reverse junction current is capacitively coupled through the oxide insulator and appears across the load terminals of the device.

The memory capacitor shown in FIG. 1 is comprised by an electrically conducting film 1 of metal or semiconductor which:

(i) is thin enough to interfere only slightly with the transmission of electrons of energy 5 kev or greater
(ii) adheres well to insulator layer 2
(iii) imposes a uniform electrical potential upon the interface it shares with the insulator layer 2
(iv) maintains its mechanical and electrical properties in a vacuum environment; and
(v) is typically 5 nanometers to 500 nanometers thick and preferably comprises a refractory metal or metals.

An insulating film 2, preferably silicon dioxide, which is normally an electrical insulator but which is capable of supporting the transport of electric charge across its thickness when subjected to electron beam irradiation, is provided. It must also be capable of maintaining at each location the internal electrical charge distribution imposed during the electron beam irradiation of that location until further irradiation is imposed on the location. This insulator layer is typically 50 nanometers to 1,000 nanometers thick but is sufficiently thin to permit an electron beam of energy 5 kev or greater directed through the conducting gate 1 to penetrate to some degree within the underlying semiconductor layer 3.

The semiconductor layer 3 is a semiconductor film or layer which exhibits N-type electrical conductivity at or near room temperature. This layer is typically 50 nanometers to 5,000 nanometers thick and exhibits electrical resistivity in the range of 0.005 to 10 ohm centimeters. It is essential that the N-type semiconductor buried layer 3 be subject to the influence of electrical charges stored locally at different site locations within the insulator layer 2. It is also essential that layer 3 share a metallurgical interface with an underlying silicon semiconductor substrate as illustrated in FIG. 1 and that together semiconductor layer 3 and the substrate form a bipolar semiconducting junction.

In preferred forms of the invention an optional layer 4 is included. Optional layer 4 is a very high resistivity (herein referred to as "intrinsic") semiconducting layer of either N-type of P-type having a typical thickness of 2 micrometers. If used, layer 4 is regarded as the top layer of the substrate and layer 5 represents the balance of the semiconducting substrate. While the use of the "intrinsic" layer 4 is preferred, its use is optional and practical devices can be fabricated with the layer 3 and the layer 5 described hereinafter in direct contact to form the bipolar semiconducting junction.

As portrayed in FIG. 1, layer 5 may be regarded as a nominally homogeneously doped layer of P-type semiconductor having typical resistivity values ranging from 0.01 to 500 ohm centimeters and a thickness of from 150 nanometers to 400 micrometers. As will be described hereinafter with relation to the other figures, layer 5 may be more complex than is illustrated in FIG. 1 but the topmost sublayer of the semiconductor substrate such as layer 5 remains P-type. It is essential that during the readout of data stored in the memory capacitor structure, that this P-type layer function as a sink or collector for holes which are produced within the N-layer 3 by electron irradiation and which traverse the thickness of layer 4 and enter layer 5. Layers 3, 4 and 5 comprise the rectifying detector junction hereinafter identified as the "buried junction".

The structure is completed by an electrically conducting layer 6 formed on the bottom side of the memory capacitor structure having a thickness of from 50 nanometers to 5 micrometers and electrically connecting wires for leads 7 and 8 are secured to the conducting layers 1 and 6, respectively to allow for application of suitable bias potentials during the write and read operations as well as to derive data output signals indicative of data stored in the structure.

Where the memory capacitor structure shown in FIG. 1 is used in an actual memory, it is initially assumed that data is stored over the entire upper planar surface area of the device. To introduce new data in a certain site or block of such sites (generally a narrow strip nominally of an electron beam diameter or two in width i.e., 3–5 microns) one executes a WRITE cycle which consists of two irradiation treatments of the memory capacitor structure as briefly described above. The first irradiation is performed by scanning an electron beam along a narrow strip or strips where the block of data is to be stored with a positive bias on the order of 20 volts applied to the gate via lead 7 relative to lead 8 while modulating the current or position of the beam. The effect of this treatment is to wipe away portions of previously stored data charge patterns within insulating layer 2 and to selectively charge areas of insulating layer 2. The second irradiation is performed by again scanning the electron beam, which is modulated according to the inverse of the data intended to be stored, along the same strips of the block where the data is to be stored but in this scan striking sites not selected during the first scans with a negative bias on the order of 20 volts applied to the gate (terminal lead 7) relative to the terminal lead 8. For convenience, the above briefly described data storage technique is referred to as a positive-negative WRITE cycle. Another perfectly legitimate WRITE cycle, referred to as the negative-positive WRITE cycle, employs precisely the same irradiation treatment, but the potential biases applied to the gate lead 7 relative to substrate lead 8 are reversed from those described above.

The READOUT of data previously stored at any location in the memory capacitor structure as described above is accomplished by first pulsing the potential of the gate to a negative value of the order of −20 volts for a typical duration of 1 to 30 microseconds followed by an application of the FLYBY voltage bias for a duration of 1 to 30 microseconds which in turn is followed by application of a READ voltage as illustrated in FIG. 4. This procedure is followed in order to take advantage of the deep depletion readout technique described in copending U.S. patent application Ser. No. 729,274, filed concurrently with this application on Oct. 4, 1976 entitled — METHOD AND APPARATUS FOR DEEP DEPLETION READ-OUT OF MOS ELECTRON BEAM ADDRESSABLE MEMORIES — R. K. Linkuski, Inventor and assigned to Micro-Bit Corporation. The FLYBY bias is in addition to the negative pulse required to obtain the benefits of deep depletion readout and is selected to enhance recovery from the preceeding negative pulse but is always equal to or more positive than the READ voltage which is typically −5 to +30 volts as measured at the gate 1 (lead 7) relative to substrate lead 8. Upon application of READ voltage the junction remains in deep depletion, that is the depletion layer identified in FIG. 4B is thicker than when thermodynamic equilibrium applies; nevertheless the depletion layer is not so thick as to support avalanche during the READ interval. Shortly after the application of the READ voltage the electron beam is scanned rapidly along the the block of data bearing the desired information to be readout. Current flowing in the leads 7 and 8 during this READ scan, will be modulated as a result of the influence of charges previously stored in insulator layer 2 during the WRITE cycle described above as comprising either a negative-positive store cycle or a positive-negative store cycle. The modulation observed during the READ scan will be in an encoded form representative of the data (information) previously stored in the block being readout.

The underlying theory for the READ operation is best described with relation to FIG. 4 and 4B and is as follows: The intensity of the highly focussed READ electron beam is not modulated and consequently produces electron-hole pairs within the buried N-type seimconductor layer at a nearly constant rate. The holes so produced are non-equilibrium carriers which suffer one of three fates: 1) collection by the reverse biased junction, 2) recombination with electrons by trapping at the insulator-semiconductor interface, or 3) recombination at bulk recombination centers in the bulk N-type silicon layer. The latter process (identified 3 above) may be neglected for the typically thin N-type layers employed in fabricating the memory capacitor structures. In regions beneath discharged site locations, interfacial recombination and trapping pursuant to 2 above reduces the detected junction current. However, beneath the charged sites, the positive charge stored in the oxide insulator layer produces within the N-type semiconductor layer an interfacial accumulation layer of electrons and produces an electric field which repels the holes thereby increasing the current collected by the buried junction as depicted in FIG. 4B. Electrons produced within the N-layer 3 and the underlying I-layer 4 contribute to the majority electron carrier concentration in layer 3 and have no effect of consequence unless either layer 3 has a very high lateral surface electrical resistance or the produced electron concentration within layer 3 becomes comparable to or greater than the equilibrium electron concentration.

The buried junction metal-insulator-semiconductor memory capacitor structure described with relation to FIG. 1 lacks certain features which, in practice, are necessary to assure high performance, reliability and fast memory speeds. The first and one of the most important features is the provision of a means for enclosing the N-type semiconductor overlayer in order to insure, that after application of READ bias and upon initiation of the READ scan that none or only a small amount of reverse junction current flows at the perimeter of this N-layer. If no provision is made to limit such perimeter or peripheral reverse current to a practical minimum, such current could mask or drown out the desired output data signals during the READ cycle. Thus, for improving signal to noise performance, some means must be provided for enclosing this N-layer to ensure that edge leakage is limited during the READ scan.

FIG. 2 of the drawings is a cross sectional view of a preferred form of memory capacitor structure constructed in accordance with the invention which includes such an enclosure means. It is a perimeter avalanche device. As shown in FIGS. 2, 2A and 2B, the perimeter or peripheral edge current may be suppressed by employing a heavily doped P-type semiconductor region 9 which completely surrounds and isolates the N-type semiconductor layer and prevents exterior leakage electrical access to the N-layer. The richly doped P-type region 9 intermingles with the P-layer 5 and forms an interface with N-layer 3 and the oxide insulator layer 2 so as to completely surround and isolate the N-layer 3. By this means, one is assured that the READ scan will be performed with reverse bias conditions obtained across the bipolar N/I/P junction with minimal reverse current flow at the peripheral edges of the device. As stated before layer 4 is an optional layer which tends to reduce the junction capacitance. FIG. 2A is a plan view of the device shown in cross section in FIG. 2. FIG. 2B is a cross section of a variation of the perimeter avalanche device shown in FIG. 2 wherein the buried N-type layer 3 interfaces directly with the P-type layer 5 without the intervening I layer 4 and the gate 1 is electrically isolated from layer 11.

The precursor bias conditions required for inducing a reverse bias across the bipolar junction during the READ cycle was described briefly in the preceeding discussion. The function of this induced reverse bias condition is to make the underlying P-type region a better sink or collector of holes produced within the N-type region by the penetrating electron beam and also to provide internal power gain for the signal as carried by the modulated flux of holes which impact the N/I/P sensing junction during the READ scan as explained more fully in the above referenced copending U.S. application Ser. No. 729,274. Rapid recovery from the pre-READ preparative bias cycling is enhanced by fabricating the perimeter highly doped P-type region 9, and the resultant bipolar P-N junction which it forms with the N-layer 3, in a manner such that it conducts (by carrier tunnelling or avalanche) in the manner of commercial "zener" diodes. That is to say, for a reverse voltage exceeding a particular design value, for example 10 volts, the junction would be highly conducting whereas for a lesser value of reverse bias, negligible reverse current would flow.

This latter, "zener" feature is also important to the WRITE process. Upon application of a positive charge bias to the gate 1 by lead 7, one wishes to have most of that voltage appear across the oxide insulator layer 2 to support the rapid development of "charge" state upon irradiation. If the underlying N/I/P bipolar semiconducting junction formed between N-layer 3 and P-layer 5 or the P-N junction formed between the N-layer 3 and peripheral richly doped P region 9, were ideal rather than having the avalanche characteristic described above, only a small fraction of the positive voltage would appear across the oxide insulator layer. This would impact adversely upon the ability to properly store charges in the oxide insulator layer during the WRITE process as well as the WRITE rate and the performance of the memory system as a whole.

Layer 10 in FIG. 2 and layer 11 in FIG. 2B are comprised of electrically conducting material which is of sufficient thickness to strongly attenuate 5 keV to 10 keV electrons arriving at the target. These beam stop layers protect from irradiation the portion of the insulator 2 which overlies the transition from region 9 to region 3, thereby minimizing radiation induced degradation of the junction properties. The potential applied to layer 11 by means of contact lead 12 is selected to be very close to the potential applied to lead 7 during WRITE and READ irradiations in order to minimize mispositioning of the incident electron beam due to electrostatic fields emanating from either the gate 1 or the beam stop ring 11 and terminating on the other.

FIG. 3 is a circuit model of the memory capacitor structure shown in FIG. 2 of the drawings and accurately exhibits the circuit properties of the device. From this circuit model it will be seen that the major central area N/I/P junction formed by layers 3, 4 and 5 forms a hard diode. A hard diode conducts very little current when large (e.g. 100 volts) reverse voltage is applied. The P-N junction formed by the interface of the richly doped peripheral P-region 9 with the side edges of the N-layer 3 forms the perimeter avalanche diode which limits the voltage that can be developed across the junction capacitance formed between the quasineutral electrically conducting regions of layers 3 and 5. The capacitance of the oxide insulator layer is exhibited as the gate to N-layer capacitance and is in series with the parallel combination of the junction and the two junction diodes. From this circuit model it will be appreciated that after application of a negative gate bias, called PREPULSE, in preparation for READ as described briefly above, a large current will flow immediately after a positive going gate bias excursion to FLYBY bias voltage level, and that this current must be allowed to settle substantially before the READ voltage is applied and the READ electron beam scan is subsequently initiated, otherwise circuit noise associated with continued avalanche of the junction may compromise the READ output signal. This bias sequence is illustrated in FIG. 4 and a representation of the current flowing in the access leads 7 and 8 in response to this sequence in biases is shown in FIG. 4A. The READ scan is initiated at the time indicated in FIGS. 4 and 4A as T4. The avalanche may still be in progress at the conclusion of the FLYBY interval as shown in FIG. 4A but the negative going gate potential variation occurring at the transition to READ voltage reduces the reverse voltage on the buried junction sufficiently to halt the avalanche process. Nevertheless, the junction will have acquired a reverse junction bias.

The buried junction metal-insulator-semiconductor memory capacitor structure shown in FIG. 2 may be manufactured in numerous ways which are well established in the art of semiconductor device fabrication. For example, starting with a substrate comprised of a near-intrinsic semiconducting layer 4 overlying a P-type silicon wafer 5, one sequence may involve first the formation of an N-type semiconductor layer 3 over the topside of the semiconductor substrate either by diffusion or ion implantation of phosphorus, arsenic or antimony. Alternatively, an N-type crystaline semiconductor layer 3 may be formed over the substrate by chemical vapor deposition of a so-called "epitaxial" layer. The richly boron doped P-type "window frame" 9 may then be produced either by thermal deposition and thermal drive of a P-type dopant (typically boron) through openings in a suitable masking layer or by ion implantation of boron through openings in such a masking layer. The masking layer would then be removed and the active oxide insulator layer 2 formed over the topside of the N-type semiconductor layer 3 and the richly doped window frame 9 in a high temperature (e.g. 1175° Centigrade) oxidizing ambient atmosphere typically oxygen. This would be followed by the deposition of a thin conducting layer 1 over the oxide insulator layer 2 by established vapor deposition techniques. Subsequently, the conducting gate island 1 is formed in the thin conducting layer by suitable photolithographic techniques. Similarly, layers 10 or 11 are deposited by established means and defined by photolithographic techniques. Then the backside insulating layer is removed and a metallic deposit 6 formed on the underside of the P-type semiconductor wafer 5 to serve as electrical contact to substrate lead 8.

From the above description of the avalanche diode effect achieved with the peripheral, richly doped semiconductor region 9, it will be appreciated that the invention provides a second essential and highly desirable feature in a suitable memory capacitor structure. This second feature which is essential for high speed, actual memory operation comprises a means for limiting the magnitude of reverse bias potential developed across the bipolar buried junction upon the application of a positive polarity potential to terminal lead 7 relative to terminal lead 8 of the device. It is particularly important that this effect be operative early in the portion of the WRITE cycle in which positive bias is applied to the gate 1 via lead 7 relative to lead 8. Otherwise the rate at which charge transport occurs within the insulator layer 2 during the WRITE interval is compromised by the development of a major fraction of the applied voltage across the major central area N/I/P junction defined by the semiconductor layers 3, 4 and 5. This would reflect adversely upon the performance of the memory system as a whole and obviously should be minimized for that reason alone.

A preferred method for limiting the induced reverse bias has been illustrated and described with respect to FIGS. 2, 2A, 2B and 3. A second preferred configuration in accordance with the invention and relying upon the same principle of operation is illustrated in cross section in FIG. 5. A variation of this configuration is shown in cross section in FIG. 5A. In these the heavily doped P-type window frame 9 does not border integrally to the N-layer 3 but the near-intrinsic layer 4 extends upward to the interface with the insulator 2, thereby separating the P-type window frame 9 from the enclosed N-type layer 3. The desired avalanche junction properties are provided by a heavily P-type doped island 13 which underlies the N-layer 3 and penetrates through the I-layer 4 and comingles with P-layer 5. This configuration is identified as a topical avalanche device. The other layers labelled in FIG. 5 serve the same functions described in the context of FIG. 2 and the electrical properties remain the same as discussed in this context as well. Fabrication of the buried junction structures shown in FIG. 5 may be accomplished in numerous ways which are well established in the manufacture of silicon devices. For example, the substrate comprised of an epitaxial I-layer 4 overlying a P-type wafer 5 may be selectively doped with boron to produce regions 9 and 13 by thermal deposition and thermal drive of boron through openings in a suitable masking layer or by ion implantation of boron through openings in such a masking layer. Then the N-type layer 3 is similarly produced by thermal or ion implant techniques of an N-type dopant (typically arsenic) using another suitably prepared masking layer. The remaining layers may then be produced in the fashion discussed earlier in the context of FIG. 2.

Another preferred embodiment of the buried junction device is a variation of the topical avalanche configuration which employs established mesa type fabrication techniques to achieve the perimeter isolation necessary for maintenance of low reverse leakage currents in the buried junction during the READ scan. Two configurations which employ this approach are shown in cross section in FIGS. 6 and 6A. Rather than employing the heavily doped P-type window frame 9 for isolation, using a suitable masking layer to protect the central area the borders of the N-type overlayer 3 and the I-layer 4 of the substrate are chemically etched away prior to formation of the other layers identified in the earlier discussion of the topical avalanche configuration. This latter configuration, shown in FIG. 6, may also be produced by steps which introduce the heavily doped P-type island 13 into the substrate prior to formation by epitaxial deposition techniques of the N-type layer 3. The insulator layer 2 may consist of one or more insulating materials, the preferred material being silicon dioxide produced by thermal oxidation of the silicon at a high temperature in an oxygen ambient. Again the beam stop ring 10 in FIG. 6 and 11 in FIG. 6A, must strongly attenuate incident irradiation to ensure the buried junction properties do not change appreciably with memory useage. These metallic layers and the backside contacting layer 6 are produced by vapor deposition and the former are shaped by photolithographic techniques.

Another preferred embodiment of the buried junction memory device shown in FIGS. 7 and 7A employs a substrate comprised of an optional near-intrinsic semiconducting layer of thickness less than 2 micrometers overlying a P-type semiconducting layer of thickness less than 5 micrometers which in turn overlies an N-type semiconductor layer of 2 micrometers to 1 millimeter in thickness. The reach through, or punch through, effect commonly observed in thin-base bipolar transistors is employed to internally limit the reverse potential difference which can be produced within a sensing junction composed of an N-type region overlying or built into the topside of the substrate together with the balance of the substrate. A richly doped P-type enclosing window frame provides junction isolation as described earlier. The substrate may be produced by a number of techniques common to the semiconductor industry, one being the sequential epitaxial growth of first a P-type semiconducting layer and then a near-intrinsic semiconducting layer over a homogeneously doped N-type semiconducting wafer. Using suitable masking layers the richly doped P-type window frame 9 and the N-type layer 3 are produced by thermal deposition and drive of suitable dopants or by ion implantation of suitable dopants. Layers 1, 2, 6, 10 and 11 may be formed by methods described in the contexts of FIGS. 2, 5 and 6 and should satisfy the requirements outlined therein. In this case the backside contact layer 6 is formed onto the N-type portion 15 of the substrate rather than onto a P-type layer.

To achieve the desired ohmic low resistance contact between the layers the doping of N-layer 15 generally must be moderate to heavy and metallic layer 6 must be alloyed thereto. The junction between N-type layer 15 and P-type layer 14 must be very soft, that is, it should have a substantial leakage current at reverse potential differences no greater than 10 volts. To accomplish this one may produce the junction to have a large doping gradient, the junction may be damaged by mechanical abuse as in the area indicated by the xxx in FIGS. 7 and 7A or a metallic layer, perhaps an extension of layer 6, may project upwards and electrically short layer 15 to layer 14 and, optionally, layer 9.

A circuit model for the device of FIGS. 7 and 7A is shown in FIG. 8. N-layer 3 may be regarded as the collector of an NPN bipolar transistor, P-layer 14 the base and N-layer 15 the emitter. The collector (3) -base (14) reverse potential difference is limited by the deletion of majority carriers (holes) in the base (14). The doping and thickness of layer 14 and layer 4 are selected to limit this voltage to approximately 10 volts. For example, in the absence of optional layer 4, a layer 14 with an acceptor doping of $5 \times 10^{15}$ ions per cubic centimeter and of 1.5 micrometers thickness will punch through at a reverse junction voltage of approximately 10 volts if layer 3 is sufficiently heavily doped.

FIGS. 9 and 9A illustrate the cross section of other preferred forms of improved buried junction metal-insulator-semiconductor memory capacitor structures employing the reach-through effect but using the mesa isolation method described in the context of FIGS. 6 and 6A. FIG. 9A is a slightly modified form in which the perimeter top layer 11 is electrically and physically separate from the main gate 1. Again, as in the earlier described reach-through device structure, provision must be made to insure the P/N junction within the substrate is soft. The methods described in the context of FIG. 8 apply similarly here. The numeral identities of the various layers and the means of fabrication of these layers are unchanged from earlier descriptions.

From the foregoing description it will be appreciated that the present invention provides new and improved buried layer metal-insulator-semiconductor memory capacitor structures for use as target elemnts with an electron beam accessible memory and allows for a new and improved method of operation of such memories in computer systems whereby simplicity of construction, high performance, reliability and fast memory speeds can be achieved.

Having described several embodiments of new and improved metal-insulator-semiconductor memory capacitor structures and having described new and improved methods of their use in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A new and improved buried junction metal-insulator-semiconductor memory capacitor target structure for electron beam addressable memories comprising a first planar semiconductor substrate layer having conductive means engaging one of the surfaces thereof for providing electrical connection to said first semiconductor layer, at least a second planar semiconductor layer of opposite conductivity type from said first semiconductor layer juxtaposed to a planar surface of said first semiconductor substrate layer, said first and second layers forming a bipolar junction, an insulating layer overlying said second semiconductor layer and a conducting surface overlying said insulating layer, said conducting surface having means for providing electrical connection thereto, enclosure means for isolating and reducing to a minimum reverse current flow at the perimeter of the bipolar junction during the READ of data and means within the memory capacitor structure for limiting internally the magnitude of the reverse current potential built up across the bipolar junction upon application of a reverse polarity potential across the structure.

2. A buried junction memory capacitor target structure according to claim 1 wherein said means for limiting internally the magnitude of the reverse polarity potential built up across the bipolar junction is formed by appropriately fabricating the first semiconductor substrate and second semiconductor layers to provide for avalanche breakdown of the bipolar junction at a desired value reverse polarity potential.

3. A buried junction memory capacitor target structure according to claim 1 wherein said means for limiting the magnitude of the reverse polarity potential and said enclosure means are comprised by a peripherally arranged region of more highly doped semiconductor material of the same conductivity type as said first semiconductor layer completely surrounding and isolating said second semiconductor layer and forming interfaces with both said first and second semiconductor layers and said insulator layer, said peripherally arranged more highly doped semiconductor region forming an avalanche diode in conjunction with said second semiconductor layer at a desired value reverse polarity potential magnitude.

4. A buried junction memory capacitor target structure according to claim 3 further including a peripherally arranged mass of electron beam blanking material disposed on the upper surface of said structure for shielding the PN junction formed by the interface of the peripherally arranged region of more highly doped semiconductor material with the second semiconductor layer.

5. A buried junction memory capacitor target structure according to claim 1 wherein said first and second semiconductor layers are separated by a layer of intrinsic semiconductor and said first, intrinsic and second planar semiconductor layers are substantially co-extensive along two orthogonal axes and form a substantial tabular surface on which data sites can be arrayed for accessing by an electron beam.

6. A buried junction memory capacitor target structure according to claim 5 wherein said means for limiting internally the magnitude of the reverse polarity potential built up across the bipolar junction is formed by appropriately fabricating the first semiconductor substrate and second semiconductor layers to provide for avalanche breakdown of the bipolar junction at a desired value reverse polarity potential.

7. A buried junction memory capacitor target structure according to claim 5 wherein said enclosure means and said means for limiting the magnitude of the reverse polarity potential built up across the bipolar junction comprises a peripherally arranged region of more highly doped semiconductor material of the same conductivity type as said first semiconductor substrate layer completely surrounding and isolating said second semiconductor layer and forming interfaces with both said first and second semiconductor layers and said insulator layer, said peripherally arranged more highly doped semiconductor region forming a PN avalanche diode junction with said second semiconductor layer at a desired value reverse polarity potential magnitude and comprising only a small proportion of the total planar area of the memory capacitor structure forming the tabular surface on which data is stored.

8. A buried junction memory capacitor target structure according to claim 5 further including a peripherally arranged mass of electron beam blanking material disposed on the upper surface of said structure for shielding the PN avalanche diode junction formed by the interface of the peripherally arranged region of more highly doped semiconductor material with the second semiconductor layer.

9. A buried junction memory capacitor target structure according to claim 5 wherein the enclosure means for isolating and reducing to a minimum reverse current flow at the perimeter of the bipolar junction is comprised by fabricating the second semiconductor layer as an island and extending the intrinsic semiconductor layer around the periphery of the second semiconductor layer island up to interface with the insulator layer.

10. A buried junction memory capacitor target structure according to claim 9 further including a peripherally arranged region of more richly doped semiconductor material of the same conductivity type as said first semiconductor layer and forming interfaces with said first semiconductor substrate layer and said extension of the intrinsic semiconductor surrounding the second semiconductor layer island.

11. A buried junction memory capacitor target structure according to claim 10 wherein said means for limiting the magnitude of the reverse polarity potential built up across the bipolar junction, comprises a relatively small region of richly doped semiconductor material of the same conductivity type as said first semiconductor layer buried within and extending through said intrinsic layer to form a richly doped abrupt PN junction island region with the second semiconductor layer and structured such that upon the reverse potential magnitude across the bipolar junction attaining a desired value, avalanche breakdown and conduction through the abrupt PN junction island occurs and the reverse voltage appearing across the bipolar junction is limited.

12. A buried junction memory capacitor target structure according to claim 10 further including a peripherally arranged mass of electron beam blanking material disposed on the upper surface of said structure for shielding the junction formed by the peripherally surrounding regions of the intrinsic and richly doped semiconductor layers with the second semiconductor layer.

13. A buried junction memory capacitor target structure according to claim 5 wherein the enclosure means for isolating and reducing to a minimum reverse current flow at the perimeter of the bipolar junction is comprised by fabricating said second semiconductor layer and said intrinsic semiconductor layer in the form of mesa layers having slightly less peripheral dimensions than said first semiconductor layer and extending the insulator layer to completely cover the top and side surfaces of the mesa-shaped second semiconductor layer, the sides of the intrinsic semiconductor layer and the exposed surfaces of the first semiconductor layer surrounding the mesa-shaped intrinsic and second semiconductor layers.

14. A buried junction memory capacitor target structure according to claim 13 wherein said means for limiting the magnitude of the reverse polarity potential built up across the bipolar junction, comprises a relatively small region of richly doped semiconductor material of the same conductivity type as said first semiconductor layer buried within and extending through said intrinsic semiconductor layer to form a richly doped abrupt PN junction island region with the second layer and structured such that upon the reverse potential magnitude across the bipolar junction attaining a desired value, avalanche breakdown of the abrupt PN junction island region occurs and the reverse voltage appearing across the bipolar junction is limited.

15. A buried junction memory capacitor target structure according to claim 14 further including a peripherally arranged mass of electron beam blanking material disposed on the upper surface of said target structure for shielding the peripheral regions of the mesa-shaped second semiconductor layer.

16. A buried junction memory capacitor target structure according to claim 12 wherein said means for limiting the magnitude of the reverse polarity potential build-up across the bipolar junction, comprises appropriately fabricating the underlying first semiconductor substrate layer of two opposite conductivity type semiconductor layers to form a thin-base bipolar junction transistor capable of operating in a reach through conduction mode for internally limiting the value of the reverse polarity potential that can be built up across the target structure.

17. A buried junction memory capacitor target structure according to claim 16 wherein the two opposite conductivity type semiconductor layers comprising the underlying first semiconductor substrate layer and forming the thin-base bipolar junction transistor are fabricated to form a soft junction with substantial leakage current under reverse bias potential conditions.

18. A buried junction memory capacitor target structure according to claim 13 wherein said means for limiting the magnitude of the reverse polarity potential build-up across the bipolar junction, comprises appropriately fabricating the underlying first semiconductor substrate layer of two opposite conductivity type semiconductor layers to form a thin-base bipolar junction transistor capable of operating in a reach through conduction mode for internally limiting the value of the reverse polarity potential that can be built up across the target structure.

19. A buried junction memory capacitor target structure according to claim 18 wherein the two opposite conductivity type semiconductor layers comprising the underlying first semiconductor substrate layer and forming the thin-base bipolar transistor are fabricated to form a soft junction with substantial leakage current under reverse bias potential conditions.

20. In a new and improved method for recording and readout of data with an electron beam addressable memory employing a planar metal-insulator-semiconductor memory capacitor structure having a pair of opposed load terminals and a first semiconductor layer of a first conductivity type forming a bipolar junction with a second semiconductor substrate layer of opposite conductivity type from said first semiconductor layer, and wherein the electric charges are stored in the insulator layer at selected information storage locations on the planar surface of the memory capacitor device while leaving other selected information storage locations free of electric charges to thereby record data on the memory capacitor device for subsequent read-out, the writing and removal of electric charges with subsequent read-out of the data thus recorded requiring the simultaneous application of a bias potential of suitable polarity and magnitude across the memory capacitor device opposed load terminals together with the probing of the selected information storage locations with a finely focused electron beam of suitable energy level to penetrate into the first semiconductor layer at the selected information storage location, and during read-out capacitively coupling the resultant reverse bipolar junction current flow produced at the selected information storage locations as a result of the combined effect of the bias potential and the penetrating electron beam through the pair of opposed load terminals to provide an output indication of the character of the data stored at the location being probed; the improvement comprising internally isolating the peripheral regions of the bipolar junction to reduce to the greatest possible extent reverse current flow at the periphery of the bipolar junction during the application of a reverse polarity potential across the bipolar junction and internally limiting to a predesigned low value the magnitude of the reverse polarity potential built-up across the bipolar junction upon a reverse polarity bias potential being applied across the opposed load terminals of the memory capacitor device.

21. A method according to claim 20 wherein the reverse polarity potential built up across the bipolar junction is limited to a predesigned low value by avalanche breakdown of the junction.

22. A method according to claim 20 wherein the magnitude of the reverse polarity potential built up across the bipolar junction is limited to a predesigned low value through zener diode action.

23. The method according to claim 20 wherein the magnitude of the reverse polarity potential built up across the bipolar junction is limited to a predesigned low value by reach through of majority carriers from the first semiconductor layer to a highly doped semiconductor island region of the same conductivity type as the first semiconductor layer buried in the second semiconductor layer.

24. The method according to claim 20 further including applying a precursor conditioning voltage step across the memory capacitor structure just prior to read-out with the electron beam, the voltage step applied to the gate relative to the substrate corresponding in polarity to the polarity of the majority carriers in the underlying semiconductor substrate, and applying a short time duration fly-by bias potential across the memory capacitor structure which is equal to or greater in value to the bias potential applied during read-out, said fly-by bias potential being applied for a short time duration immediately following the precursor conditioning voltage step and just prior to read-out.

25. The method according to claim 24 wherein the memory capacitor structure employs an underlying P-type semiconductor substrate, and wherein the precursor conditioning voltage step is a positive going voltage step produced by the trailing edge of a negative going voltage pulse produced in the bias potential applied across the memory capacitor structure just prior to read-out.

26. The method according to claim 25 wherein momentary negative going voltage pulses produced in the bias potential applied across the memory capacitor structure, are provided at the commencement of each line of scan or at the commencement of a sequence of line scans of the electron beam.

27. A method according to claim 26 wherein the negative voltage pulses applied across the memory capacitor structure at the commencement of the scan of each line or group of lines of the reading electron beam probe start at either a charge or read potential magnitude for a short time duration and thereafter go to the read-out potential magnitude to thereby produce the negative going pulse having a positive going trailing edge followed immediately by a fly-by bias interval at the commencement of the scan of each line or group of lines of the reading electron beam.

28. A method for read-out of data stored in a metal-insulator-semiconductor memory capacitor structure having a gate electrode and an underlying semiconductor substrate and wherein a predetermined read-out potential magnitude and polarity is established across the memory capacitor while discrete storage sites are interrogated by an electron beam probe and the magnitude of the resultant electron-hole memory capacitor discharge current obtained from probing a particular site with the electron beam is indicative of the character of data stored at the site; the improvement comprising applying a precursor conditioning voltage step across the memory capacitor structure just prior to read-out with the electron beam, the voltage step applied to the gate electrode relative to the underlying semiconductor substrate corresponding in polarity to the polarity of the majority carriers in the underlying semiconductor substrate, and applying a short time duration fly-by bias potential across the memory capacitor structure which is equal to or greater in magnitude to the read-out potential, said fly-by bias potential being applied for a short time duration immediately following the precursor conditioning voltage step and just prior to the application of the read-out potential.

29. The method according to claim 28 wherein the memory capacitor structure comprises a metal-oxide-semiconductor memory capacitor employing an underlying P-type semiconductor substrate, and wherein a positive going voltage step is applied across the memory capacitor structure just prior to read-out with the electron beam, the positive going voltage step being produced by the trailing edge of a negative voltage pulse in the bias potential applied across the memory capacitor structure just prior to read-out.

30. The method according to claim 29 wherein momentary negative going voltage pulses produced in the bias potential applied across the memory capacitor structure are provided at the commencement of each line of scan or at the commencement of a sequence of line scans of the electron beam.

31. The method according to claim 30 wherein the negative voltage pulses applied across the memory capacitor structure at the commencement of the scan of each line or group of lines of the reading electron beam probe start at either a charge or read potential magnitude, go to a discharge potential magnitude, return to the fly-by bias potential magnitude for a short time duration and thereafter go to the read-out potential magnitude to thereby produce the negative going pulse having a positive going trailing edge followed immediately by a fly-by bias interval at the commencement of the scan of each line or group of lines of the reading electron beam.

* * * * *